(12) United States Patent
Wang

(10) Patent No.: US 7,057,477 B2
(45) Date of Patent: Jun. 6, 2006

(54) INTEGRATION OF FBAR FILTER(S) AND ON-CHIP INDUCTORS

(75) Inventor: Li-Peng Wang, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 55 days.

(21) Appl. No.: 10/746,022

(22) Filed: Dec. 24, 2003

(65) Prior Publication Data

US 2005/0140468 A1    Jun. 30, 2005

(51) Int. Cl.
  *H03H 9/54*   (2006.01)
  *H03H 9/56*   (2006.01)
(52) U.S. Cl. ..................... 333/189; 333/191; 310/324
(58) Field of Classification Search ........ 333/186–192; 310/324
  See application file for complete search history.

(56) References Cited

U.S. PATENT DOCUMENTS

| | | | |
|---|---|---|---|
| 5,075,641 A * | 12/1991 | Weber et al. ............ | 331/108 C |
| 5,185,589 A * | 2/1993 | Krishnaswamy et al. ... | 333/133 |
| 5,194,836 A * | 3/1993 | Vale et al. .................. | 333/133 |
| 5,294,898 A * | 3/1994 | Dworsky et al. ........... | 333/187 |
| 5,789,845 A * | 8/1998 | Wadaka et al. ............ | 310/334 |
| 6,262,637 B1 * | 7/2001 | Bradley et al. ............. | 333/133 |
| 6,377,137 B1 | 4/2002 | Ruby ......................... | 333/189 |
| 6,407,649 B1 * | 6/2002 | Tikka et al. ................ | 333/133 |
| 6,472,954 B1 * | 10/2002 | Ruby et al. ................. | 333/133 |
| 6,483,229 B1 | 11/2002 | Larson, III et al. ......... | 310/348 |
| 6,486,751 B1 | 11/2002 | Barber et al. ............... | 333/187 |
| 6,566,979 B1 | 5/2003 | Larson, III et al. ......... | 333/187 |
| 6,710,681 B1 * | 3/2004 | Figueredo et al. .......... | 333/187 |
| 6,762,471 B1 * | 7/2004 | Kim ........................... | 257/414 |
| 2003/0205948 A1 * | 11/2003 | Lin et al. .................... | 310/312 |
| 2003/0227357 A1 * | 12/2003 | Metzger et al. ............. | 333/189 |
| 2004/0130410 A1 * | 7/2004 | Nishimura et al. ......... | 333/133 |

FOREIGN PATENT DOCUMENTS

JP    2003-179518    *  6/2003

OTHER PUBLICATIONS

J. Rosenbaum et al., "Design and Fabrication of Two-pole Monolithic Bulk Acoustic Filters", IEEE 1990 Microwave and Millimeter-Wave Monolithic Circuits Symposium, pp. 63-66, May 1990.*

CY. Chi et al., "Planar Millimeter-Wave Microstrip Lumped Elements Using Micro-Machining Techniques", IEEE 1994 Microwave Symposium Digest, vol. 2, pp. 657-660, May 1994.*

Y. Sun et al., "Suspended Membrane Inductors And Capacitors For Application In Silicon MMIC's", IEEE 1996 Microwave and Millimeter-Wave Monolithic Circuits Symposium, pp. 99-102, Jun. 1996.*

C.W. Seabury et al., "Thin Film ZnO Based Bulk Acoustic Mode Filters", IEEE 1997 Microwave Symposium Digest, vol. 1, pp. 181-184, Jun. 1997.*

* cited by examiner

*Primary Examiner*—Barbara Summons
(74) *Attorney, Agent, or Firm*—Schwabe Williamson & Wyatt

(57)  ABSTRACT

A component having a FBAR filter with FBARs, and on-chip inductor are described herein.

16 Claims, 5 Drawing Sheets

DEPOSITION OF A PASSIVATION LAYER ON THE TOP SIDE AND A
HARD MASKING LAYER ON THE BOTTOM SIDE ~ 302

DEPOSITION AND PATTERNING OF THICK METAL LAYER, FOR (1) METAL
TRACE LINES, (2) BONDING PADS, AND (3) INDUCTORS ~ 304

DEPOSITION OF INTER-LAYER DIELECTRIC, CUP, AND ETCHING TO
FORM VIA ~ 306

US 7,057,477 B2

INTEGRATION OF FBAR FILTER(S) AND ON-CHIP INDUCTORS

TECHNICAL FIELD & BACKGROUND

The present invention is related to the field of Microelectromechanical Systems (MEMS). More specifically, the present invention is related to integration of film bulk acoustic resonators (FBAR) filters with on-chip inductors.

Radio frequency (RF) front-end passives, such as transceivers and receivers are increasingly needed for wireless communication. These front-end passives include front-end filters. RF front-end filters consist of FBAR have been found to have a number of advantages over other technologies, such as surface acoustic wave (SAW) devices and ceramic filters, particularly at relatively high frequencies. A FBAR filter typically consists of series FBARs as well as shunt FBARs. The bandwidth of a FBAR filter is typically limited by the electromechanical coupling ($K^2$) of piezoelectric materials. For example, the electromechanical coupling ($K^2$) of polycrystalline ZnO films is about 4%, depending on the film's crystal orientation and quality.

BRIEF DESCRIPTION OF THE DRAWINGS

The present invention will be described by way of exemplary embodiments, but not limitations, illustrated in the accompanying drawings in which like references denote similar elements, and in which.

DETAILED DESCRIPTION OF ILLUSTRATIVE EMBODIMENTS

Embodiments of the present invention include, but are not limited to, a component having FBAR filter(s) and on-chip inductors, method for making such component, and system having such component.

Various aspects of the illustrative embodiments will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative embodiments. However, it will be apparent to one skilled in the art that the present invention may be practiced without the specific details. In other instances, well-known features are omitted or simplified in order not to obscure the illustrative embodiments.

Various operations will be described as multiple discrete operations, in turn, in a manner that is most helpful in understanding the present invention, however, the order of description should not be construed as to imply that these operations are necessarily order dependent. In particular, these operations need not be performed in the order of presentation.

The phrase "in one embodiment" is used repeatedly. The phrase generally does not refer to the same embodiment, however, it may. The terms "comprising", "having" and "including" are synonymous, unless the context dictates otherwise.

Figure 1:
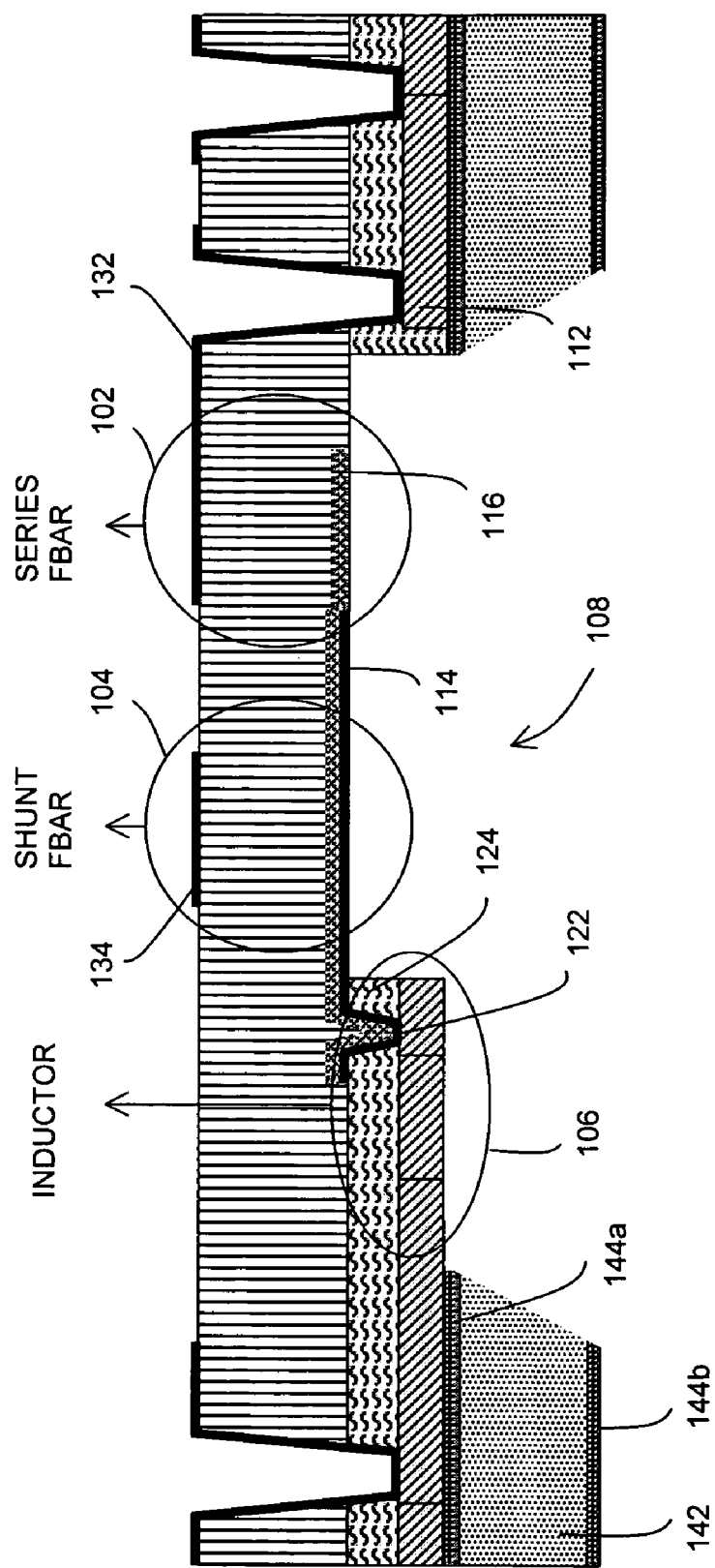
FIG. 1 illustrates a cross sectional view of a portion of a component with two FBARs and an on-chip inductor, in accordance with one embodiment.

Referring now to FIG. 1, wherein a cross sectional view of a portion of a component having a FBAR filter and an on-chip inductor in accordance with one embodiment is shown. As illustrated, for the embodiment, component 100 includes a FBAR filter having series FBAR 102 and shunt FBAR 104. Further, component 100 includes on-chip inductor 106 electrically coupled to FBAR 102 and 104, and cavity 108 exposing undersides of the metal layers employed to form on-chip inductor 106 (hereinafter, simply inductor), and FBAR 102 and 104.

Resultantly, the FBAR filter may be responsive to signals over a wider bandwidth, without the needs of disposing long line inductors on a circuit board on which component 100 is to be mounted, and coupling the long line inductors to FBARs 102 and 104.

Figure 2:
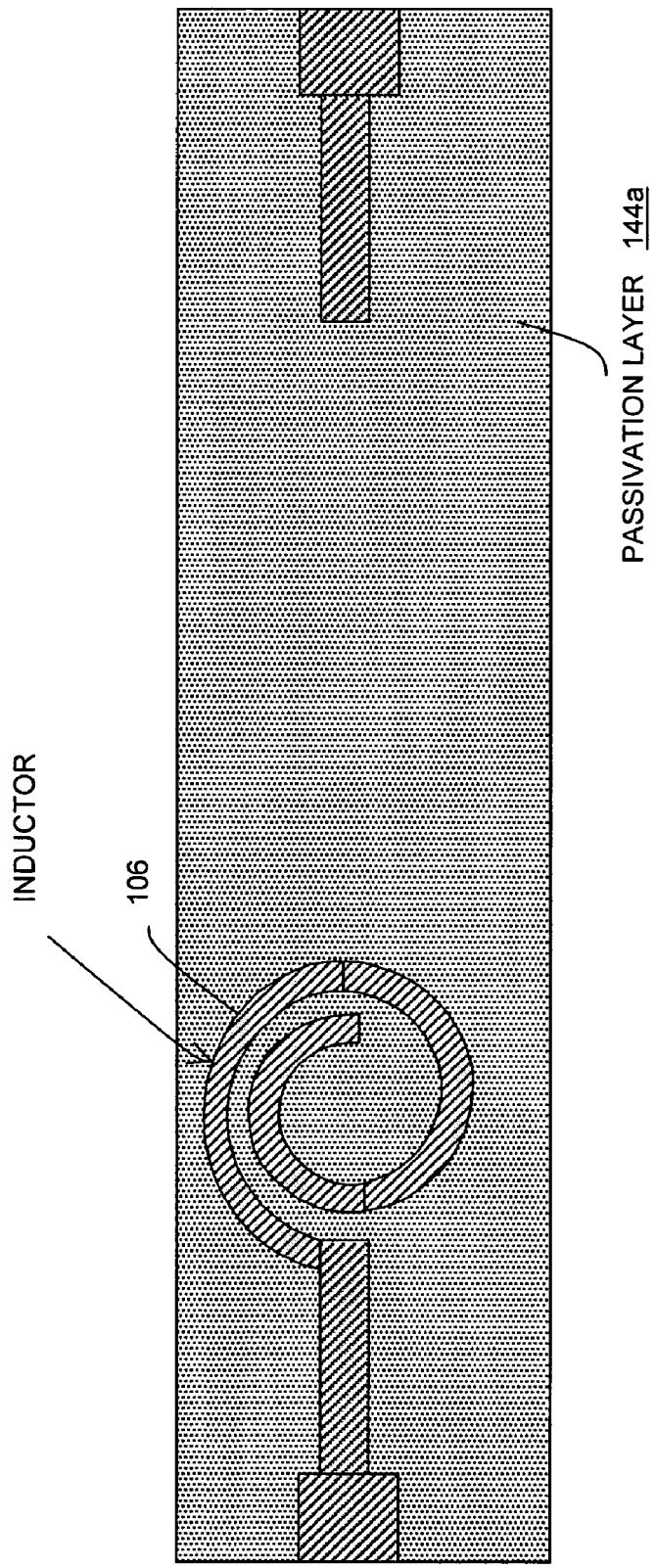
FIG. 2 illustrates an exposed top view of the inductor of FIG. 1 in accordance with one embodiment.
Figure 3A:
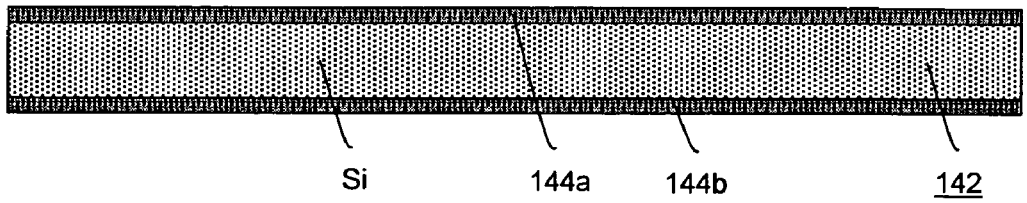
FIGS. 3a–3f illustrate a method for making the on-chip inductor and the FBAR of FIG. 1, in accordance with one embodiment.
Figure 3B:
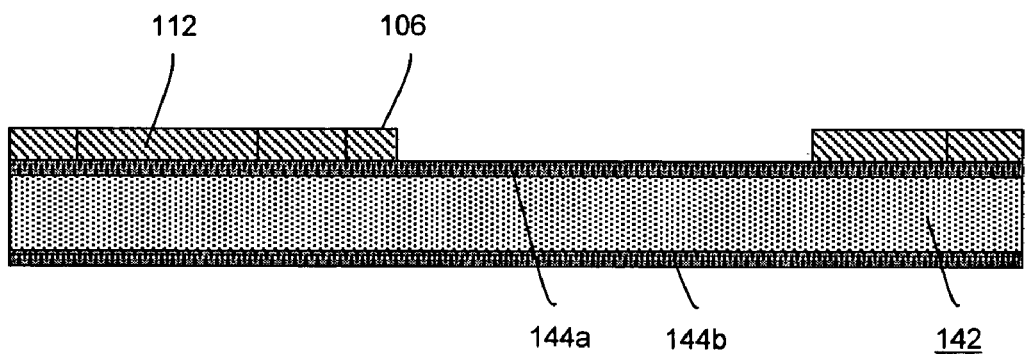
Figure 3C:
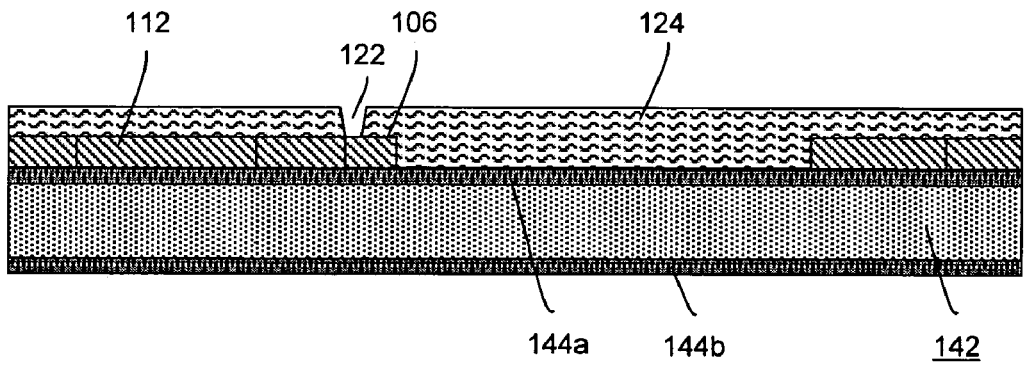
Figure 3D:
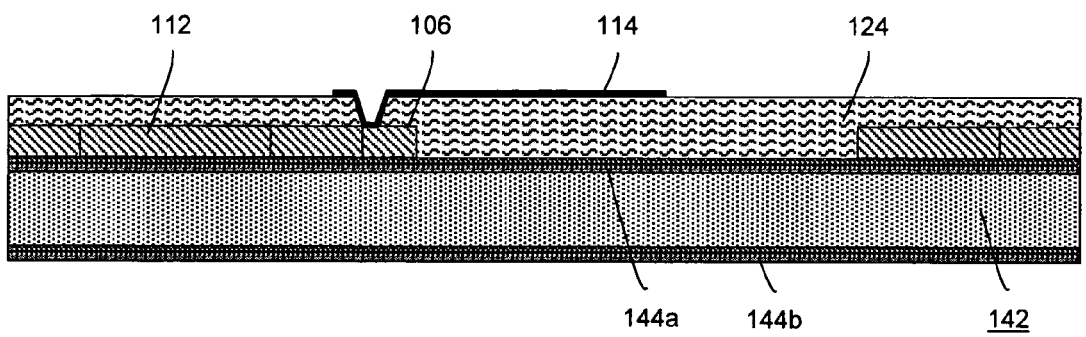
Figure 3E:
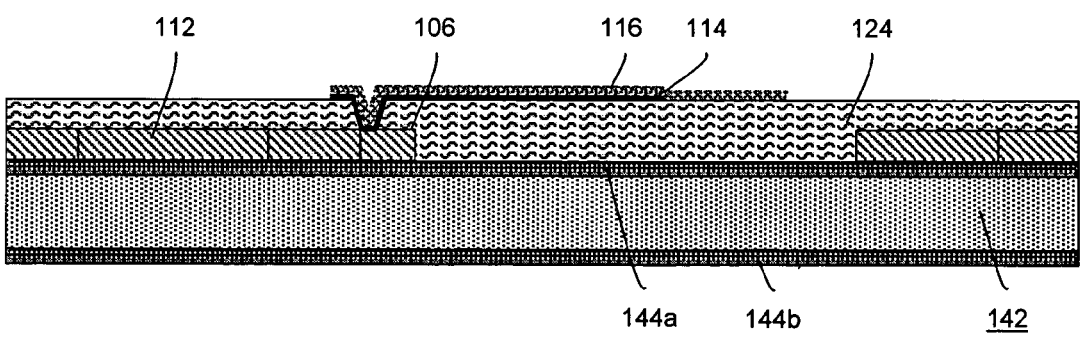
Figure 3F:
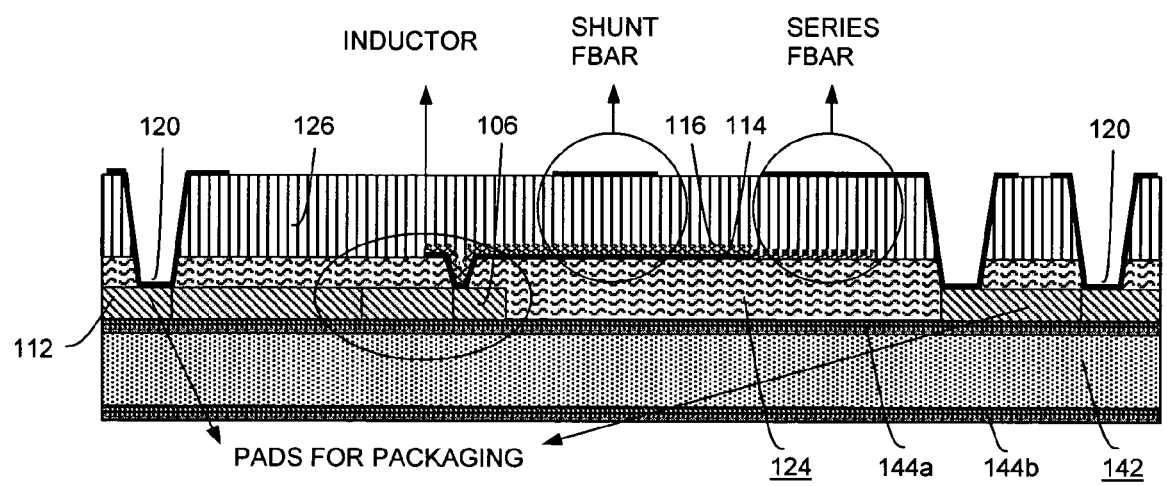

As illustrated, for the embodiment, inductor 106 is formed on a portion of metal layer 112, which is exposed by via 122. Further, for the embodiment, inductor 106 is of a coil type (see also FIG. 2 which illustrates an exposed top view of inductor 106 formed on top of passivation layer 144a, without the higher layers). In alternate embodiments, inductor 106 may have a different form factor.

Series FBAR 102, more specifically, its bottom electrode, is formed on a portion of metal layer 116. Its top electrode is formed by metal 132. Shunt FBAR 104, more specifically, its bottom electrode, on the other hand, is formed with corresponding portions of metal layer 114 and 116. Its top electrode is formed by metal 134. The portion of metal layer 116 contributing in the forming of shunt FBAR 104 has a thickness that is thicker than the thickness of the portion of metal layer 116 contributing in the forming of series FBAR 102.

For the embodiment, metal layer 116 is electrically coupled to metal layer 114, which except for the portion disposed in via 122, is generally separated from metal layer 112 by inter-layer dielectric layer 124. By virtue of metal layer 114 being electrically coupled to via 122, metal layer 116 is also in electrical contact with metal layer 112. Further, top electrode 132 of series FBAR 102 is also in electrical contact with metal layer 112. [Note that these electrical connections are circuit dependent. In other applications or embodiments, series FBAR 102 and shunt FBAR 104 may be electrically coupled to each other and other circuit elements in other manners.]

In various embodiments, each of metal layers 112, 114 and 116 may be formed employing a metal such as aluminum (Al), molybdenum (Mo), platinum (PI), or other materials with like properties.

In various embodiments, metal layer 112 is a relatively thick metal layer, with a thickness greater than 0.7 μm.

In various embodiments, the inter-layer dielectric layer may be formed employing dielectric material such as silicon oxide ($SiO_2$) or other dielectic materials of like properties.

It should be noted that while for ease of understanding, only two FBAR 102–104 and one inductor 106 are shown in FIG. 1, in alternate embodiments, component 100 may include more or less FBAR and/or inductors.

FIGS. 3a–3f illustrate a method of making component 100 in accordance with one embodiment. The method reflects the desired electrical connections between the top and bottom electrodes of series FBAR 102 and shunt FBAR 104 and other circuit elements of the embodiment. In alternate embodiments, the method may be modified to accommodate other desired electrical connections between the top and bottom electrodes of series FBAR 102 and shunt FBAR 104 and other circuit elements.

For the embodiment, passivation layer 144a and hard mask 144b are first deposited on a top side and a bottom side of substrate 142 respectively, op 302. In various embodiments, substrate 142 may be a silicon (Si) substrate, and passivation layer and hard mask 144a–144b may be formed employing silicon nitride (SiN), deposited through low pressure chemical vapor deposition (LPCVD).

Next, metal layer 112, including inductor 106, may be formed by deposition and patterning, op 304. In various embodiments, portions of metal layer 112 are also patterned to form bonding pads of component 100.

Then, inter-layer dielectric layer 124 is formed on top of metal layer 112 by deposition (and optionally, chemical mechanical polishing (CMP)), and via 122 is formed by etching, op 306.

Thereafter, metal layer 114 is formed on top of a portion of inter-layer dielectric layer 124, including via 122, op 308, by deposition, patterning and etching. Thus, metal layer 114 is electrically coupled to metal layer 112 through via 122.

Next, metal layer 116 is formed on top of metal layer 114 and inter-layer dielectric layer 124 by deposition and patterning, op 310. Thus, metal layers 114 and 116 are in electrical contact with each other. Further, metal layer 116 is also in electrical contact with metal layer 112 through metal layer 114. As described earlier, the "thinner" portion of metal layer 116 forms a part of series FBAR 102 (bottom electrode), and the corresponding portions of metal layers 114 and 116 form a part of shunt FBAR 104 (bottom electrode). Further, the portion of metal layer 116 contributing in the forming of shunt FBAR filter 104 is thicker than the portion contributing in the forming of series FBAR 102.

Next, another dielectric layer 126 is deposited on top of metal layer 116, op 312. The dielectric layer 126 is etched to create the pad areas 120, op 312, and the top electrodes are deposited, op 312. In various embodiments, dielectric layer 126 may be an aluminum nitride (AlN) layer.

Finally, a series of etching are performed to create the underside cavity 108 (see FIG. 1). In various embodiments, the etching may be performed employing potassium hydroxide (KOH).

Figure 4:
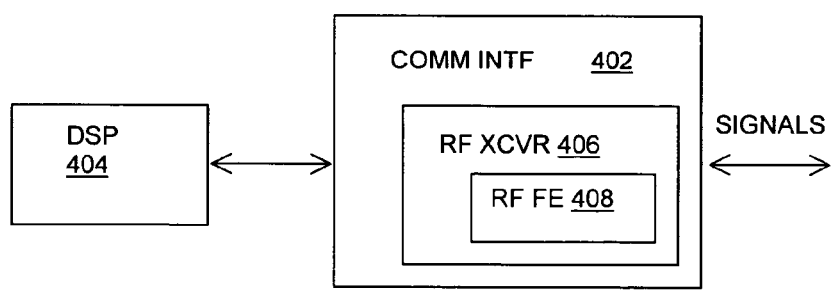
FIG. 4 illustrates a system having the component of FIG. 1 in accordance with one embodiment.

FIG. 4 illustrates a system in accordance with one embodiment. As illustrated, for the embodiment, system 400 includes a communication interface 402 for receiving and sending RF signals. Communication interface 402 includes a number of components, in particular, a RF transceiver 406 having front end 408. More specifically, for the embodiment, front end 408 is component 100 endowed with a FBAR filter, formed with FBAR 102–104 and complemented by inductor 106 as earlier described.

Further, system 400 includes digital signal processor 404 coupled to communication interface 402 for processing the signals received, and providing communication interface 402 with the signals to be transmitted.

Depending on the applications, system 400 may include other components, including but are not limited to volatile and non-volatile memory, mass storage (such as hard disk, compact disk (CD), digital versatile disk (DVD) and so forth), and so forth.

In various embodiments, system 400 may be a personal digital assistant (PDA), a wireless mobile phone, a tablet computing device, a laptop computing device, a desktop computing device, a set-top box, an entertainment control unit, a digital camera, a digital video recorder, a CD player, a DVD player, or other digital device of the like.

CONCLUSION AND EPILOGUE

Thus, it can be seen from the above descriptions, a novel component having a FBAR filter with FBAR and on-chip inductor, method for making such a component, and a system having such a component have been described. While the present invention has been described in terms of the foregoing embodiments, those skilled in the art will recognize that the invention is not limited to the embodiments described. The present invention can be practiced with modification and alteration within the spirit and scope of the appended claims.

Thus, the description is to be regarded as illustrative instead of restrictive on the present invention.

What is claimed is:

1. An apparatus comprising:
   a die;
   an inductor integrated on the die wherein the inductor comprises a portion of a first metal layer; and
   a first FBAR (film bulk acoustic resonator) integrated on the die to contribute in the forming of a FBAR filter wherein the first FBAR is electrically coupled to the inductor and comprises a portion of a second metal layer of the die and the die further comprises a cavity exposing an underside of the portion of the first metal layer, and an underside of the portion of the second metal layer; and
   a third metal layer contributing in forming a part of the first FBAR, a first portion of the third metal layer in contact with the second metal layer.

2. The apparatus of claim 1, wherein
   the first metal layer is a selected one of an Al metal layer, a Mo metal layer, and a Pt metal layer; and
   the second metal layer is a selected one of an Al metal layer, a Mo metal layer, and a Pt metal layer,
   the third metal layer is a selected one of an Al metal layer, a Mo metal layer, and a Pt metal layer.

3. The apparatus of claim 1, wherein the first FBAR is a selected one of a series FBAR and a stunt FBAR.

4. The apparatus of claim 1, wherein the apparatus includes a second FBAR integrated on the die to contribute to said forming of a FBAR filter, and the inductor being coupled to the second FBAR.

5. The apparatus of claim 4, wherein the first FBAR is a shunt FBAR, and the second FBAR is a series FBAR.

6. The apparatus of claim 5, wherein,
   the second FBAR comprises a second portion of the third metal layer.

7. An apparatus comprising:
   a die;
   an inductor integrated on the die wherein the inductor comprises a portion of a first metal layer;
   a first FBAR (film bulk acoustic resonator) integrated on the die to contribute in the forming of a FBAR filter wherein the first FBAR is electrically coupled to the inductor and comprises a portion of a second metal layer of the die;
   a third metal layer contributing in forming a part of the first FBAR, a first portion of the third metal layer in contact with the second metal layer;
   an inter-layer dielectric layer generally separating the first and second metal layers and includes at least one via electrically coupling the first and second metal layers, the inter-layer dielectric layer also separating the first and third metal layers; and a second FBAR integrated on the die to contribute to said forming of a FBAR filter, and the inductor being electrically coupled to the second FBAR, wherein the second FBAR comprises a second portion of the third metal layer, the first FBAR is a shunt FBAR, and the second FBAR is a series FBAR.

8. The apparatus of claim 7, wherein the die further comprises a cavity exposing an underside of the portion of the first metal layer, and undersides of portions of the second and third metal layers.

9. The apparatus of claim 7, wherein
the first metal layer is a selected one of an Al metal layer, a Mo metal layer, and a Pt metal layer;
the second metal layer is a selected one of an Al metal layer, a Mo metal layer, and a Pt metal layer; and
the third metal layer is a selected one of an Al metal layer, a Mo metal layer, and a Pt metal layer.

10. A method comprising:
depositing and patterning a first metal layer, with a portion of which forming an inductor;
forming a via to expose a portion of the inductor;
depositing a second metal layer, with at least a portion being deposited over the via, to electrically couple the second metal layer to the inductor; and
depositing a third metal layer, with at least a portion being deposited over the second metal layer, the corresponding portions of the second and third metal layers contributing in forming a part of a first FBAR, and another portion of the third metal layer contributing in forming a part of a second FBAR.

11. The method of claim 10, further comprising prior to said depositing of the second metal layer,
depositing an inter-layer dielectric on top of the fist metal layer; and
etching a location of the inter-layer dielectric to form the via to expose the inductor.

12. The method of claim 10, further comprising etching to form a cavity to expose an underside of the portion of the first metal layer of the inductor, and undersides of the portions of the second and third metal layers of the first and second FBAR.

13. A system comprising:
a communication interface including a component having
a die,
an inductor integrated on the die having a portion of a first metal layer; and
a first FBAR integrated on the die to contribute in forming of a FBAR filter, with the FBAR being electrically coupled to the inductor, having a portion of a second metal layer, and including a portion of a third metal layer in contact with the second metal layer;
a second FBAR integrated on the die to contribute in forming of the FBAR filter, wherein the second FBAR comprises another portion of the third metal layer, said portions of the third metal layer of die first and second FBARs having different thickness, and the inductor being also electrically coupled to the second FBAR; and
a signal processor coupled to the communication interface.

14. The system of claim 13, wherein the die further comprises a cavity exposing an underside of the portion of the first metal layer of the inductor, and undersides of the portions of the second and third metal layers of the first and second FBAR.

15. The system of claim 13, wherein the system is a selected one of a PDA, a wireless mobile phone, a set-top box, an entertainment control unit, a digital camera, a digital video recorder, a CD player, and a DVD player.

16. The system of claim 13, wherein
the second metal layer is electrically coupled to the first metal layer.

* * * * *

UNITED STATES PATENT AND TRADEMARK OFFICE
CERTIFICATE OF CORRECTION

PATENT NO. : 7,057,477 B2  Page 1 of 1
APPLICATION NO. : 10/746022
DATED : June 6, 2006
INVENTOR(S) : Wang It is certified that error appears in the above-identified patent and that said Letters Patent is hereby corrected as shown below:

Column 2

Lines 12, 15, "...FBAR 102 and 104..." should read --...FBARs 102 and 104...--.

Line 32, "...metal layer 114 and 116. ..." should read --...metal layers 114 and 116. ...--.

Line 60, "...FBAR 102-104..." should read --...FBARs 102-104...--.

Column 3

Line 53, "...FBAR 102-104..." should read --...FBARs 102-104...--.

Column 5

Line 35, "...fist metal..." should read --...first metal...--.

Column 6

Line 20, "...of die first..." should read --...of the first...--.

Signed and Sealed this

Fifth Day of August, 2008

JON W. DUDAS
*Director of the United States Patent and Trademark Office*